United States Patent
Caron et al.

(10) Patent No.: US 7,820,611 B2
(45) Date of Patent: Oct. 26, 2010

(54) COMPOSITION COMPRISING,1,1,3,3-PENTAFLUOROBUTANE, METHYLENE CHLORIDE AND TRANS-1,2-DICHLOROETHYLENE

(75) Inventors: Laurent Caron, Sainte Foy les Lyon (FR); Jean-Pierre Lallier, Saint Bonnet de Mure (FR); Gerard Guilpain, Brindas (FR)

(73) Assignee: Arkema France, Colombes (FR)

( * ) Notice: Subject to any disclaimer, the term of this patent is extended or adjusted under 35 U.S.C. 154(b) by 257 days.

(21) Appl. No.: 11/573,147

(22) PCT Filed: Jul. 20, 2005

(86) PCT No.: PCT/FR2005/001849

§ 371 (c)(1),
(2), (4) Date: Dec. 11, 2008

(87) PCT Pub. No.: WO2006/027439

PCT Pub. Date: Mar. 16, 2006

(65) Prior Publication Data

US 2009/0101177 A1    Apr. 23, 2009

(30) Foreign Application Priority Data

Aug. 18, 2004 (FR) .................................. 04 08957

(51) Int. Cl.
*C11D 7/50* (2006.01)

(52) U.S. Cl. ............................ 510/411; 510/177; 252/67
(58) Field of Classification Search .................. 510/177, 510/411; 252/67
See application file for complete search history.

(56) References Cited

U.S. PATENT DOCUMENTS

| | | | |
|---|---|---|---|
| 5,348,681 | A | 9/1994 | Desbiendras et al. |
| 5,350,534 | A | 9/1994 | Michaud |
| 6,174,850 | B1 | 1/2001 | Michaud |
| 6,877,337 | B2 | 4/2005 | Francois et al. |
| 6,951,835 | B1 * | 10/2005 | Minor et al. ................ 510/410 |
| 7,468,142 | B2 * | 12/2008 | Dournel ........................ 252/8 |
| 7,531,496 | B2 * | 5/2009 | Minor et al. ................ 510/411 |
| 7,737,098 | B2 * | 6/2010 | Lallier ........................ 510/177 |
| 2004/0013610 | A1 | 1/2004 | Dournel |
| 2004/0171510 | A1 * | 9/2004 | Minor et al. ................ 510/410 |
| 2008/0061272 | A1 * | 3/2008 | Caron et al. ................ 252/364 |
| 2009/0048138 | A1 * | 2/2009 | Lallier ........................ 510/364 |
| 2010/0029531 | A1 * | 2/2010 | Marhold et al. ............. 510/175 |

* cited by examiner

*Primary Examiner*—Gregory E Webb
(74) *Attorney, Agent, or Firm*—Steven D. Boyd

(57) ABSTRACT

The present invention relates to a composition based on 1,1, 1,3,3-pentafluorobutane (HFC-365 mfc), that can be used in deposition, cleaning, degreasing and drying applications. Its object is also a fluid for cleaning internal heat-transfer systems. The object of the present invention is also a method for dissolving oil and for cleaning.

10 Claims, No Drawings

COMPOSITION COMPRISING,1,1,3,3-PENTAFLUOROBUTANE, METHYLENE CHLORIDE AND TRANS-1,2-DICHLOROETHYLENE

FIELD OF THE INVENTION

The present invention relates to a composition based on 1,1,1,3,3-pentafluorobutane (HFC-365 mfc), that can be used in deposition, cleaning, degreasing and drying applications. Its object is also a fluid for cleaning internal heat-transfer systems. The object of the present invention is also a method for dissolving oil and for cleaning.

BACKGROUND OF THE INVENTION

Solvent power is generally characterized by the Kauri-Butanol index which is the volume in ml at 25° C. of a solvent necessary to produce a defined degree of turbidity when 20 g of a standard solution of Kauri resin in n-butanol is added. This index is equal to 57 for 1,1-dichloro-1-fluoroethane (known under the name HCFC-141b).

Apart from its good solvent power, HCFC-141b is also characterized by a low surface tension (equal to 19.3 mN/m) which gives it very good surface wettability. Since the boiling point of HCFC-141b is equal to 32° C., this enables it to evaporate rapidly and in this way to facilitate deposition of dissolved products onto substrates. Finally, HCFC-141b does not have a closed cup flash point and is therefore a non-flammable solvent.

HCFC-141b thus possesses properties that give it a good ability to dissolve many organic compounds, in particular silicone oils.

However, by reason of its action on the ozone layer which is not zero (ozone degradation potential ODP=0.11), HCFC-141b is subject to important regulations that increasingly aim to eliminate it. Thus, the European regulations on substances harmful for the ozone layer (No. 2037/2000) prohibits the use of HCFCs (hydrochlorofluorocarbons) such as HCFC-141b in solvent applications after $1^{st}$ Jan. 2002, except for the aeronautic and aerospace fields where prohibition takes effect from 2009 in Europe.

Document EP 974642 proposes an azeotropic composition of 1,1,1,3,3-pentafluorobutane (known under the name HFC-365 mfc) and 1,1,1,2,3,4,4,5,5,5-decafluoropentane (known under the name HFC-4310mee) as substitutes for HCFC-141b because they do not have any effect on the ozone layer. However, the Kauri-Butanol index of such a composition is much lower than for HCFC-141b. The Kauri-Butanol index for HFC-365mfc is 12 and is equal to 9 for HFC-4310mee.

Document EP 1 354 985 proposes, by replacing HCFC-141b, a cleaning fluid for refrigeration installations comprising a cleaning oil mixed with a liquefied carrier gas with which it forms a cleaning foam by expansion.

Moreover, a composition is known comprising 30 to 70% by weight of 1,1,1,3,3-pentafluorobutane and 70 to 30% by weight of methylene chloride (FR 2 694 942).

A composition is also known from document WO 00/56833 comprising HFC-4310mee, HFC-365mfc and trans-1,2-dichloroethylene. Examples 4 and 5 of this document describe solubility tests at ambient temperature with mineral oil and silicone oil DC-200.

Moreover, within the field of environmental protection, the current tendency is towards a reduction in solvent emission by evaporation. Thus in many so-called emissive applications, that is to say for which the solvent is capable of evaporating into the air, solvents are sought that are effective at a lower temperature than ambient.

DETAILED DESCRIPTION OF THE INVENTION

The present invention thus provides:
1) a composition comprising 1,1,1,3,3-pentafluorobutane, methylene chloride and trans-1,2-dichloroethylene.
2) a composition comprising 25 to 69% by weight of HFC-365 mfc, 25 to 69% by weight of methylene chloride and 1 to 40% by weight of trans-1,2-dichloroethylene.
3) a composition comprising 40 to 57% by weight of HFC-365 mfc, 30 to 43% by weight of methylene chloride and 1 to 30% by weight of trans-1,2-dichloroethylene.

Compositions according to the present invention can be prepared by mixing the different constituents. They are advantageously prepared by adding trans-1,2-dichloroethylene to an azeotropic or almost azeotropic composition of HFC-365 mfc and methylene chloride.

Compositions according to the present invention can be used in industry for cleaning, degreasing and drying very diverse solid surfaces (metal, glass, plastic or composite parts). They can also be used in the manufacture of printed circuits to remove residues of substances used for improving the quality of soldered joints. This removal operation is referred to in the trade by the term "defluxing".

Compositions according to the present invention can advantageously be used for depositing medical-grade silicone oils onto instruments, for example onto syringe needles or for catheters. Moreover, they can be used for depositing silicone oils onto kitchen utensils.

These compositions can also be used as an agent for depositing greases or silicone-based polymers or in cleaning formulations for parts covered with silicone oils or greases.

The compositions according to the present invention can also be used for dissolving silicone oils entering into the formulation of anti-adhesive agents (often in the form of aerosols) for moulds in processes for manufacturing plastic parts (extrusion).

The compositions can moreover be used as an expansion agent in polyurethane foams, as an aerosol propellant agent, as a heat-transfer fluid, as a dry-cleaning agent for textiles or for cleaning refrigeration installations.

The object of the present invention is also a method for dissolving oil at a low temperature. This method is characterized in that the composition described in item 1) is used.

The method according to the present invention is preferably carried out at a temperature below 10° C. A temperature between 0 and 8° C. is also preferred. A temperature between 3 and 6° C. is advantageously chosen. The composition described in item 2) is particularly suited to the method for dissolving oil.

The method according to the present invention is advantageously carried out with a composition described in item 3).

The subject of the present invention is moreover a fluid for cleaning internal heat-transfer systems, in particular refrigeration installations. This cleaning fluid is characterized by a composition described in item 1).

A cleaning fluid is preferred with a composition such as described in item 2).

A cleaning fluid is particularly preferred with a composition such as described in item 3).

Another subject of the present invention is a method for cleaning internal heat-transfer systems, in particular refrigeration installations. This method is characterized in that a fluid is used with a composition described in item 1).

The cleaning method is preferably carried out with the aid of a fluid with a composition such as described in item 2).

A fluid with a composition such as described in item 3) is advantageously chosen for the method for cleaning internal heat-transfer systems.

EXPERIMENTAL PART

The following compositions were prepared:

Composition A: Azeotrope of 57% by weight of HFC-365mfc and 43% by weight of methylene chloride.

Composition B: 40% by weight of HFC-365mfc, 30% by weight of methylene chloride and 30% by weight of trans-1, 2-dichloroethylene.

Composition C: 51% by weight of HFC-365mfc, 39% by weight of methylene chloride and 10% by weight of trans-1, 2-dichloroethylene.

Composition D: 85% by weight of HFC-365 and 15% by weight of HFC-4310mee.

Example 1

Description of Tests on the Solubilization of a Silicone Oil

A Crompton L9000-1000 silicone oil from the Crompton Corporation (Greenwich, USA) was used. It consists of a hydroxypolydimethylsiloxane, a transparent liquid with a density of 0.97 at ambient temperature (22° C.), a boiling point above 200° C. and a flash point of 132° C. (Pensky-Martens method, closed cup).

Mixtures were prepared at ambient temperature, namely at 22° C. Thus, 18 ml of the composition to be tested and 1.94 g of silicone oil were introduced into a 50 ml flask, that is to say a 10% by volume solution was prepared. The mixture was then agitated manually for 5 minutes.

A portion of the mixture prepared in this way was left to stand at ambient temperature (22° C.) for 24 hours. Another portion was left to stand at a low temperature (6° C.) for 7 days.

The appearance of the mixture was precisely observed at the end of a period of storage at different temperatures. It was considered that there was solubility at ambient temperature or at 6° C. when the mixture was transparent, clear, homogeneous, monophase and stable.

Results

| Composition | Solubility at 22° C. | Solubility at 6° C. |
|---|---|---|
| HCFC-141b | YES | YES |
| Composition A | YES | NO |
| Composition B | YES | YES |

Example 2

Description of the Flammability Test

In order to evaluate the flammability of the compositions, we determined their flash point according to the standard SETAFLASH closed cup method ASTM D3828. The flash point is the minimum temperature at which a liquid emits vapours sufficient to form at its surface a mixture that is flammable in air under the action of a source of ignition, but without flames persisting on withdrawing the activating energy.

We repeated the measurement 5 times for each of the compositions.

Results

| Composition | FLASH POINT |
|---|---|
| HCFC-141b | NO |
| Composition A | NO |
| Composition B | NO |

Example 3

Description of the Measurement of Evaporation Rate

A square-shaped stainless steel mesh was used having 4 cm sides and possessing 30 wires per cm. This type of close-aperture mesh enabled good retention of the solvent to be achieved after wetting.

The mesh was dipped into a 100 ml beaker containing 80 ml of the composition to be tested held at ambient temperature, with stable, controlled ventilation.

A stop-watch was started that measured the evaporation rate at the moment the mesh, totally immersed in the composition to be tested, was withdrawn. The end of evaporation was determined by observing the composition front that migrated with time (the front disappeared at the instant evaporation finished). Fifteen measurements were taken and the mean value of these measurements is given in the table below.

Results

| Composition | Evaporation time |
|---|---|
| HCFC 141b | 14 seconds |
| Composition A | 18 seconds |
| Composition B | 15 seconds |

Example 4

Cleaning of a Refrigeration Installation

A cleaning test was carried out at ambient temperature on the following assembly, a refrigeration installation with an internal volume of approximately 7 L.

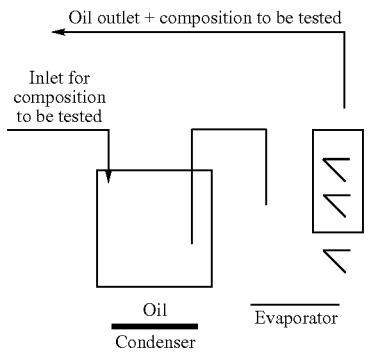

1) 50 g of contaminated lubricating oil (LUNARIA SR 68) was introduced into the condenser.

2) The composition C or D was introduced into the system via a pump or by pressurizing with nitrogen until all the refrigeration system was full.

3) Most of the composition C or D was then removed by pressurizing with nitrogen.

4) The residue was removed by drawing it off under vacuum.

The following table gives the residual mass contained in the installation and the time of drawing off under vacuum to arrive at this point.

| Composition | Vacuum (h) | Mass remaining (g) |
|---|---|---|
| HCFC-141b | 2 | 0 |
| Composition C | 2 h 30 | 0 |
| Composition D | 4 | 38 |

The invention claimed is:

1. Composition comprising 1,1,1,3,3-pentafluorobutane, methylene chloride and trans-1,2-dichloroethylene.

2. Composition according to claim 1, characterized in that it comprises 25 to 69% by weight of 1,1,1,3,3-pentafluorobutane, 25 to 69% by weight of methylene chloride and 1 to 40% by weight of trans-1,2-dichloroethylene.

3. Composition according to claim 1 characterized in that it comprises 40 to 57% by weight of 1,1,1,3,3-pentafluorobutane, 30 to 43% by weight of methylene chloride and 1 to 30% by weight of trans-1,2-dichloroethylene.

4. Method for dissolving oil at a temperature below 10° C., characterized in mixing a sufficient quantity of a composition according to claim 1 and oil at a temperature below about 10° C. to dissolve said oil.

5. Method according to claim 4, characterized in that the dissolution temperature lies between 0 and 8° C.

6. Fluid for cleaning internal heat-transfer systems, characterized by a composition according to claim 1.

7. Method for cleaning heat-transfer systems, characterized in adding a composition according to claim 1 to a heat transfer system and circulating said composition in said heat transfer system.

8. Method according to claim 4, characterized in that the dissolution temperature lies between 3 and 6° C.

9. Method for forming polyurethane foam characterized in mixing a polyol and an isocyanate with a foam blowing agent comprising a composition according to claim 1.

10. An aerosol propellant agent comprising a composition according to claim 1.

* * * * *